United States Patent
Sunaga et al.

[19]

[11] Patent Number: 6,031,318
[45] Date of Patent: Feb. 29, 2000

[54] SURFACE MOUNTABLE CRYSTAL OSCILLATING DEVICE AND METHOD OF PRODUCING THE SAME

[75] Inventors: Kenji Sunaga; Hideo Hoshi; Masayoshi Shiraishi; Kishirou Nakamura; Takashi Konno, all of Chiba, Japan

[73] Assignee: Seiko Instruments Inc., Japan

[21] Appl. No.: 09/047,854

[22] Filed: Mar. 25, 1998

[51] Int. Cl.[7] .................................................. H01L 41/04
[52] U.S. Cl. .......................... 310/340; 310/344; 310/348
[58] Field of Search .................................. 310/340, 344, 310/348; 361/807, 809, 820, 821; 174/50, 52.2

[56] References Cited

U.S. PATENT DOCUMENTS

| | | | |
|---|---|---|---|
| 4,306,343 | 12/1981 | Rochat et al. | 29/25.35 |
| 4,670,816 | 6/1987 | Johnk et al. | 361/323 |
| 5,640,746 | 6/1997 | Knecht et al. | 29/25.35 |
| 5,773,914 | 6/1998 | Gottier | 310/344 |

FOREIGN PATENT DOCUMENTS

2-055727 4/1990 Japan.
4-077103 3/1992 Japan.

*Primary Examiner*—Thomas M. Dougherty
*Assistant Examiner*—Peter Medley
*Attorney, Agent, or Firm*—Adams & Wilks

[57] ABSTRACT

A crystal oscillating device comprises an outer case having a longitudinal axis, a cavity, a pair of first surfaces extending along the longitudinal axis, a pair of second surfaces extending in a direction generally transverse to the longitudinal axis, a first opening portion in one of the first surfaces for providing access into the cavity, a second opening portion in one of the second surfaces, and a groove in the other of the second surfaces. A crystal oscillator is disposed in the cavity of the outer case and has lead terminals extending through the second opening portion of the outer case for electrically connecting the crystal oscillator to a circuit board. A bonding material is disposed in the cavity of the outer case for bonding the crystal oscillator to the outer case. A connecting member is disposed in the groove of the outer case for connecting the outer case to the circuit board.

33 Claims, 6 Drawing Sheets

SURFACE MOUNTABLE CRYSTAL OSCILLATING DEVICE AND METHOD OF PRODUCING THE SAME

BACKGROUND OF THE INVENTION

1. Field of the Invention

The present invention relates to a surface mountable crystal oscillator, such as a quartz oscillator, which is press-inserted into a cylindrical case in vacuum or an inert gas atmosphere and is airtightly sealed and, more specifically, to a crystal oscillating device having a crystal oscillator and to a method of producing the crystal oscillating device.

2. Background Information

In recent years, a portable, small and lightweight information terminal such as a pager, a portable telephone, and a PHS have become popular. In order to increase the mounting density to a circuit board an electric part which can be mounted on the surface of the circuit board by reflow soldering or the like, is used. A quartz oscillator as a reference of a time or a frequency is mounted in such electric instruments. Concerning the quartz oscillator as well, various surface mounting types have been proposed and have been put into practical use for miniaturization, lightening, thinning, or automatization of assembly.

Japanese Patent Application Laid-Open No. Hei. 4-77103 discloses a cylindrical quartz oscillator airtightly sealed in an outer case having an opening portion. The cylindrical quartz oscillator is brought into close contact with the outer case having a storage space and is stored therein. A lead terminal of the cylindrical quartz oscillator is bent toward an outside bottom surface of the outer case. Two dummy terminals are provided at the outside bottom surface of the same outer case. The dummy terminals can be soldered to a board.

However, such a conventional quartz oscillator has problems as follows. When the case storing the quartz oscillator is used, if the case has a complicated shape, the cost is high and the assembly is not easy. Since the quartz oscillator is stored in the outer case while being brought into close contact with the storage space of the outer case, the quartz oscillator may slide relative to the storage case, or get out of place. Further, since the outer lead terminal is bent toward the bottom surface of the case, the outer lead terminal is concealed by the case, so that positioning accuracy at mounting to a printed wiring board and the inspection of connection and fixation becomes extremely difficult, and there is a fear that the quartz oscillator falls out of the board by a shock. Moreover, there is a fear that only with a flexible or metal cover, heating at reflow may have a bad influence on the characteristics of the quartz oscillator.

Thus by the foregoing conventional surface mounting quartz oscillator, it has been extremely difficult to realize a quartz oscillator having high accuracy, which can be easily assembled with the fewest possible parts.

SUMMARY OF THE INVENTION

According to the present invention, an outer case including a cavity for storing a cylindrical quartz oscillator and having an almost rectangular parallelepiped shape is made of resin. One side surface (rectangular surface) of the outer case in a long side direction is bored. An opening portion for taking out outer lead terminals of the cylindrical quartz oscillator is provided in one of both end surfaces (square) of the outer case in a short side direction, and a groove for disposing a reinforcing plate to be solder to a circuit board is formed in the other end surface. The reinforcing plate is fitted in the groove. The cylindrical quartz oscillator is bonded to the outer case by using an organic resin adhesive. The outer lead terminals of the quartz oscillator protruded from the opening portion provided in the one end surface of the outer case are bent at an obtuse angle so that they become parallel at a lower position of the bottom of the case (a plane on which the reinforcing plate is provided). The outer case storing the quartz oscillator is fixed to the circuit board through the reinforcing plate and the two outer lead terminals with reflow soldering. Then the surface mounting quartz oscillator having a connection portion for electrical connection is provided.

In the thus structured present invention, the number of parts is at a minimum and the production cost is low. Further, since the organic resin material and the cylindrical quartz oscillator are inserted into the case, and the case and the cylindrical quartz oscillator are bonded to each other by solidification of the organic resin adhesive trough heating for a short time, the assembling process is easy, and does not have an influence to the performance of the quartz oscillator. Also, since the quartz oscillator is securely held to the case by the organic resin adhesive, resistance to shock due to a vibration, a drop or the like is extremely high. Further, the outer lead terminals electrically connected to a printed wiring board are away from the case, so that the fixing stress by soldering is relieved, the connection portions of the lead terminals can be directly seen, the positioning accuracy by an automatic mounting machine is improved, and inspection of the soldering is facilitated.

DETAILED DESCRIPTION OF THE PREFERRED EMBODIMENTS

The mode of practice of the present invention will be hereinafter described with reference to the drawings showing embodiments of the present invention.

Embodiment 1

Figure 1:
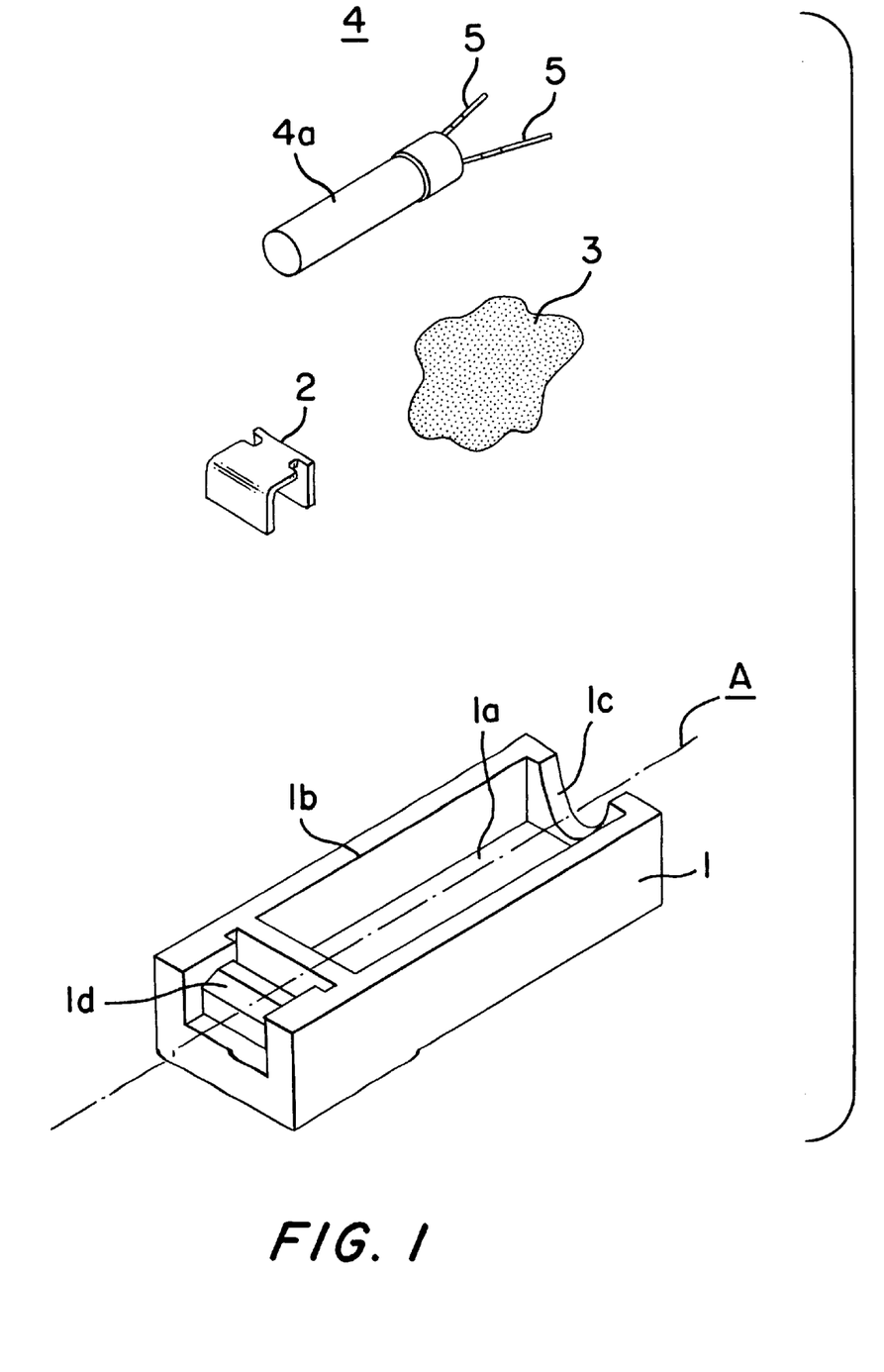
FIG. 1 is a perspective view of the assembly of a surface mounting quartz oscillator of the present invention.

In FIG. 1, a cylindrical quartz oscillator 4 is constituted by a not-shown crystal oscillating element or piece such as a quartz oscillating piece, on which an electrode is formed by a method such as photolithography, a plug 6 having outer lead terminals 5 electrically connected to the quartz oscillating piece in a state that the quartz oscillating-piece can oscillate, and a nickel silver cylindrical cap 4a for airtightly sealing the quartz oscillating piece by the plug 6. In FIG. 1, the plug 6 is not shown.

It is desirable that an outer case 1 having a longitudinal axis A and a cavity 1a for storing the cylindrical cap 4a of the cylindrical quartz oscillator has heat resistance so that the outer case 1 it can be mounted on a circuit board by reflow soldering. For example, it is possible to select a suitable material according to the usage, from various kinds of plastics such as ABS resin having excellent workability and shock resistance, PPS (Polyphenylene Sulfide) having excellent heat resistance and dimension stability over a wide temperature range, and LCP (Liquid Crystal Polymer) having excellent heat resistance, mechanical characteristics, and molding properties. An adhesive having heat resistance, such as a silicon resin based adhesive, an epoxy resin based adhesive, or a polyimide resin based adhesive, is used as an organic resin adhesive 3 for bonding the cylindrical cap 4a to the outer case 1

Figure 2:
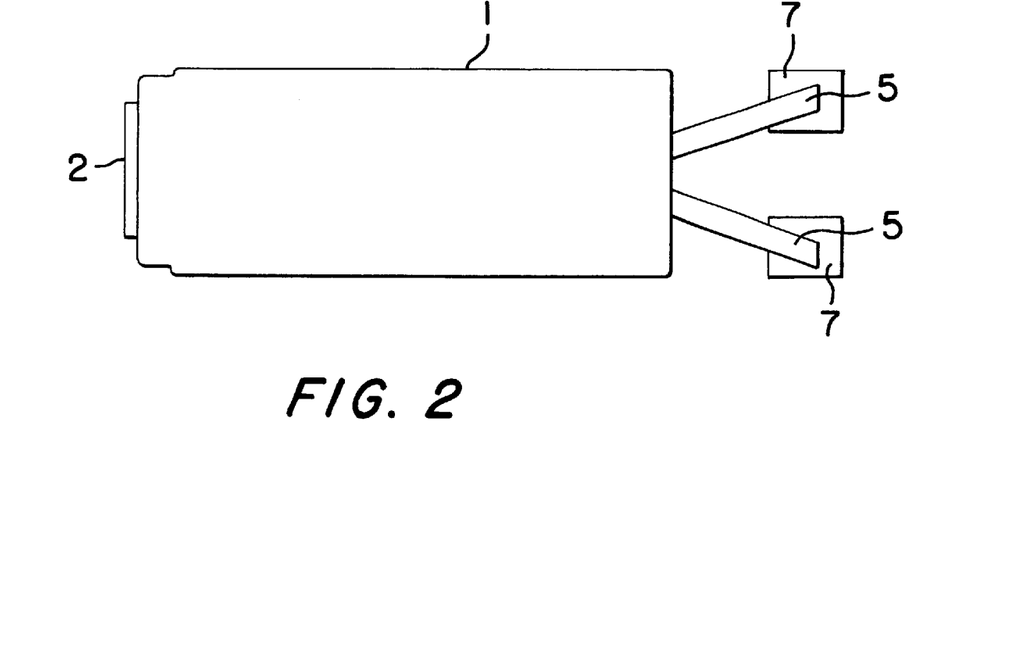
FIG. 2 is a top view of the quartz oscillator of the present invention.

One side surface parallel to the long side direction of the case is bored so that the cylindrical quartz oscillator can be easily stored. This will be referred to as a cap installation opening portion 1b. One end surface vertical to the short side direction is provided with a lead terminal opening portion 1c for taking out a pair of lead terminals of the cylindrical quartz oscillator to the outside. Various shapes are conceivable for the lead terminal opening portion 1c. As shown in FIG. 2, the shape of the lead terminal opening portion 1c may be designed so that an opening angle between the lead terminals 5 of the cylindrical quartz oscillator 4 enables solder attachment portions 7 of a circuit board to coincide with the tips of the lead terminals 5. Also, it is appropriate to contrive a shape such that the lead terminal opening portion 1c is made small like a slit or a hole so that the adhesive 3 does not leak out by means of the surface tension of the organic resin adhesive 3.

Figure 3:
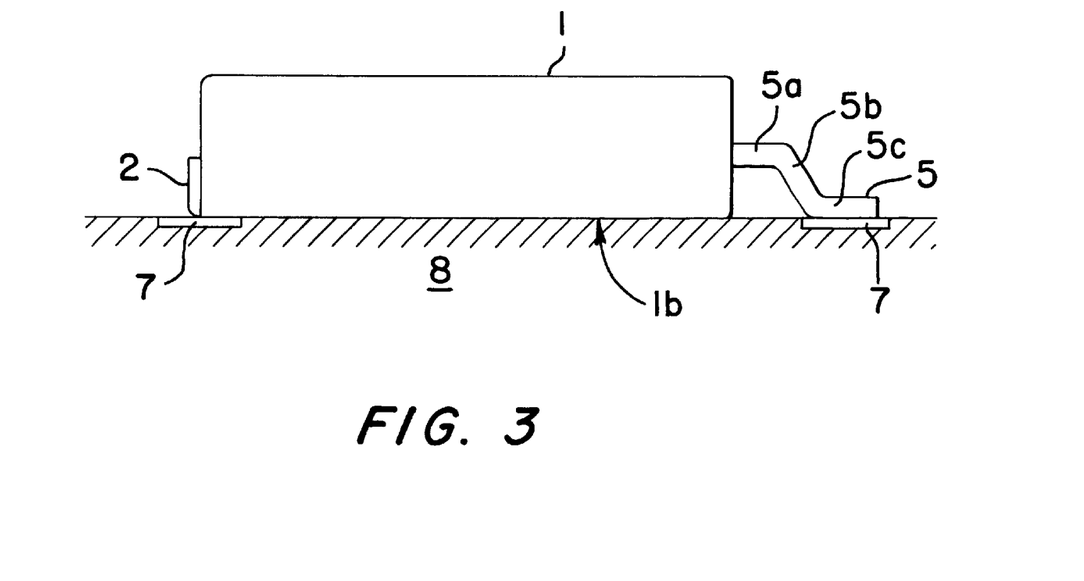
FIG. 3 is a front view of the quartz oscillator of the present invention.

As shown in FIG. 3, the outer lead terminals 5 protruding from the outer case 1 (first portion 5a) are once bent downward (in the direction of the cap installation opening portion 1b) at a position a little away from bases of the leads 5 (second portion 5b), and the outer lead terminals are again bent at a position of the bottom surface of the outer case 1 (the side of the cap installation opening portion 1b) so that the terminals 5 become parallel to the bottom surface of the case (third portion 5c). Then the tips of the third portions 5c of the lead terminals 5 are cut away to form connection portions which are electrically connected to the solder attachment portions 7 of the circuit board. The connection portions of the outer lead terminals 5 have a dimension to obtain sufficient connection strength, and when soldering is carried out to the printed wiring board at three points including a connecting member or reinforcing plate 2 disposed on the outer case 1, the property of self-alignment is improved, and the mounting strength is increased. For example, the connection portions preferably have a length 4 to 5 times a diameter of the outer lead terminals 5.

The other end surface of the outer case 1 (the surface opposite to the lead terminal opening portion 1c) is provided with a groove 1d for fixing the reinforcing plate 2. The reinforcing plate 2 is C-shaped in this embodiment and is used to further securely fix the outer case 1 to the circuit board by reflow soldering. The reinforcing plate 2 having inwardly bent tips is fixed by a spring or biasing force to a bar provided in the groove 1d so as to be fixed to the outer case 1. The reinforcing plate 2 may be fixed to the outer case 1 by insert molding.

As for a production method, a predetermined quantity of the organic resin adhesive 3 is applied into the cavity 1a of the outer case 1 by using a dispenser, and the cylindrical quartz oscillator 4 is inserted in the cavity 1a. Then the outer case 1 and the cylindrical quartz oscillator 4 are bonded to each other. By this method, since a secure connection without a gap is made between the cylindrical quartz oscillator 4 and the outer case 1, the resistance against shock is increased. Further, the outer lead terminals 5 are bent as described above after the cylindrical quartz oscillator 4 is bonded, so that the positional accuracy of the circuit board fixing position of the outer case 1 is improved, the degree of parallel is increased, and the reliability is improved.

Although the quartz oscillator 4 having the cylindrical shape has been described in the foregoing description, the present invention can be applied using a quartz oscillator having any sectional shape, such as an ellipse, a rectangle, and a square, other than cylindrical.

FIG. 3 is a front view of the surface mounting quartz oscillator in which the outer lead terminals 5 are bent downward at portions away from the bases of the leads 5, and further, the terminals are again bent so that they become parallel to the bottom surface of the outer case 1. At this time, it is desirable that the tip parallel portions of the outer lead terminals 5 are positioned lower than the bottom surface of the outer case 1. This arrangement is adopted to obtain the secure electrical conduction between the solder attachment portions 7 and the lead terminals 5 when the outer case 1 is arranged at a predetermined position of a circuit board 8 and is fixed by reflow soldering. The reinforcing plate 2 and the tip parallel portions of the outer lead terminals 5 are securely fixed by reflow soldering at the solder attachment portions 7 of circuit board 8.

Figure 4:
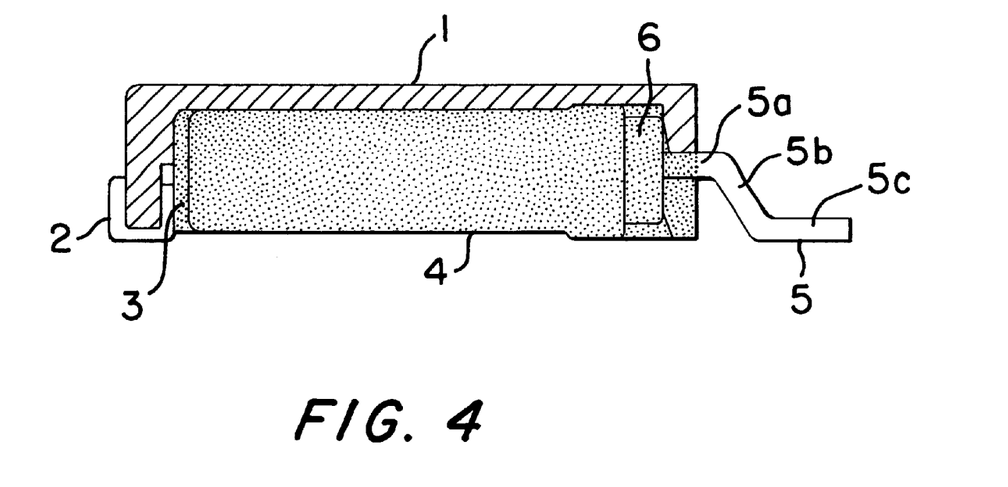
FIG. 4 is a front sectional view of the quartz oscillator of the present invention.
Figure 5:
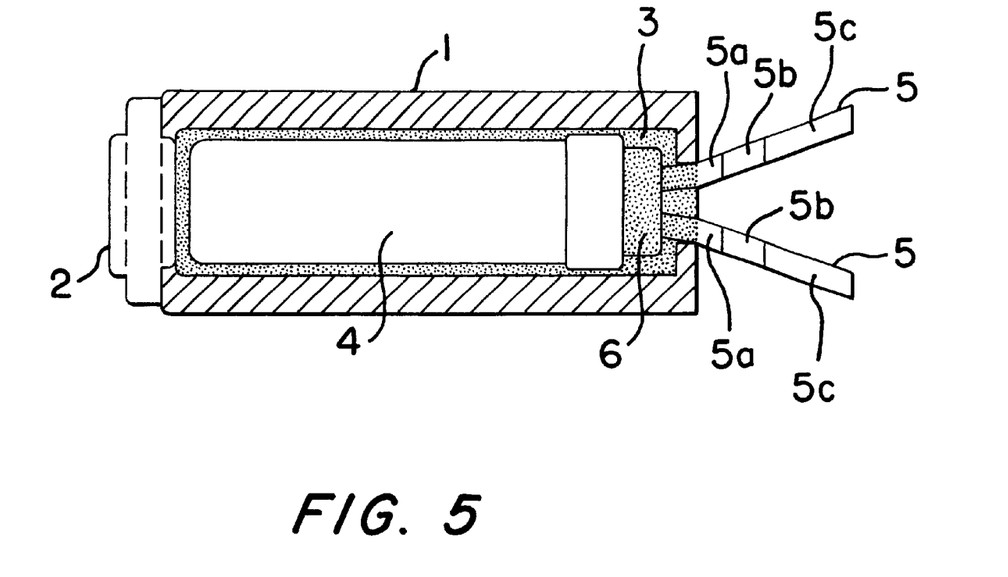
FIG. 5 is a bottom view of the quartz oscillator of the present invention.
Figure 6:
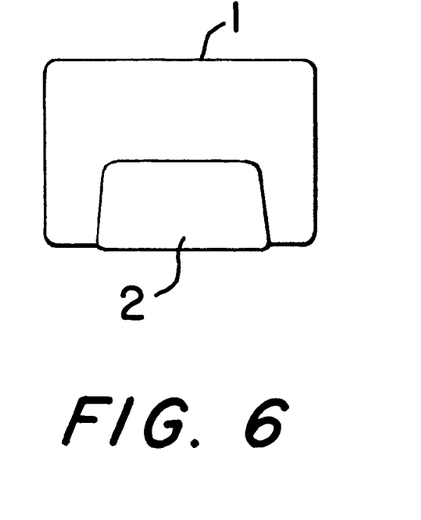
FIG. 6 is a side view of the quartz oscillator of the present invention.
Figure 7:
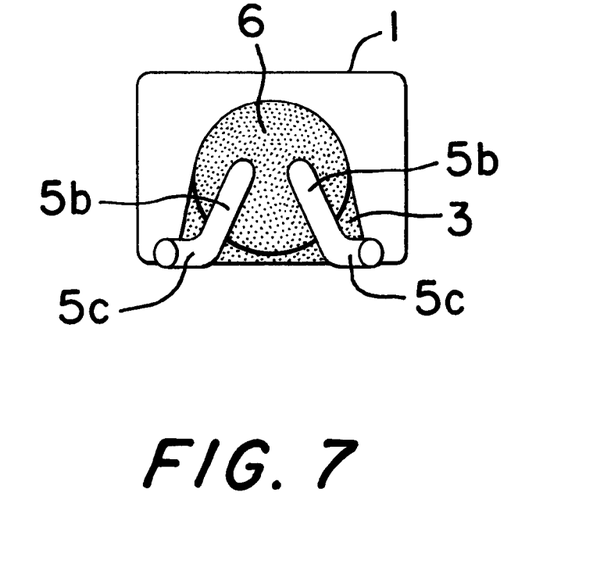
FIG. 7 is a side view of the quartz oscillator of the present invention.

FIG. 4 is a front sectional view of the surface mounting quartz oscillator, and shows the organic resin adhesive 3 for bonding of the quartz oscillator 4, the plug 6 for sealing of the cap 4a, the lead terminals 5 coming out from the plug 6, and the reinforcing plate 2. FIG. 5 is a bottom view of the surface mounting quartz oscillator, and shows the, state that the organic resin adhesive 3 is filled in the gaps formed by the cavity 1a of the outer case 1, the cap 4a, and the plug 6, thereby bonding the quartz oscillator 4. FIG. 6 is a left side view of the surface mounting quartz oscillator, and shows the outer case 1 and the reinforcing plate 2. FIG. 7 is a right side view of the surface mounting quartz oscillator, in which the organic resin adhesive 3 bonds the outer case 1 and the quartz oscillator 4 to each other, and the plug 6 and the lead terminals 5 are shown. According to such embodiment 1, a small and inexpensive surface mounting quartz oscillator can be realized.

Embodiment 2

Figure 8:
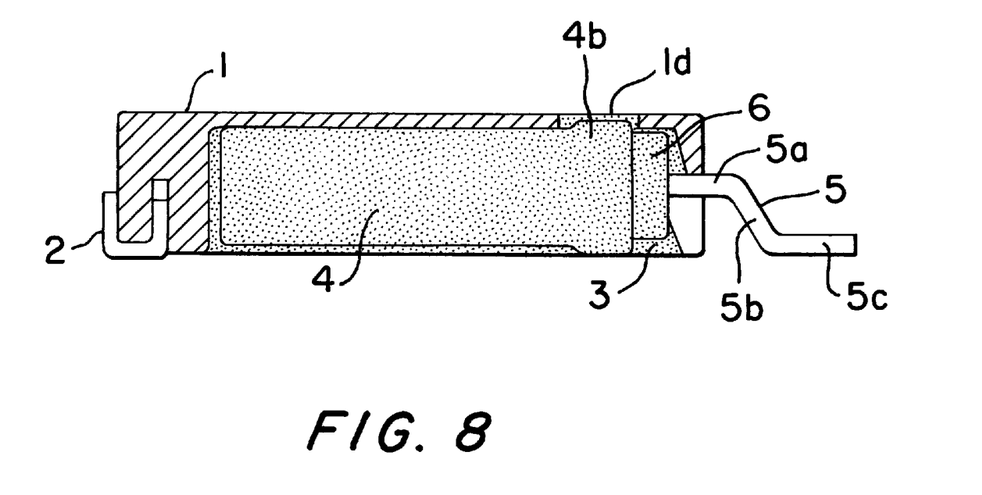
FIG. 8 is a front sectional view of a quartz oscillator of the present invention.
Figure 9:
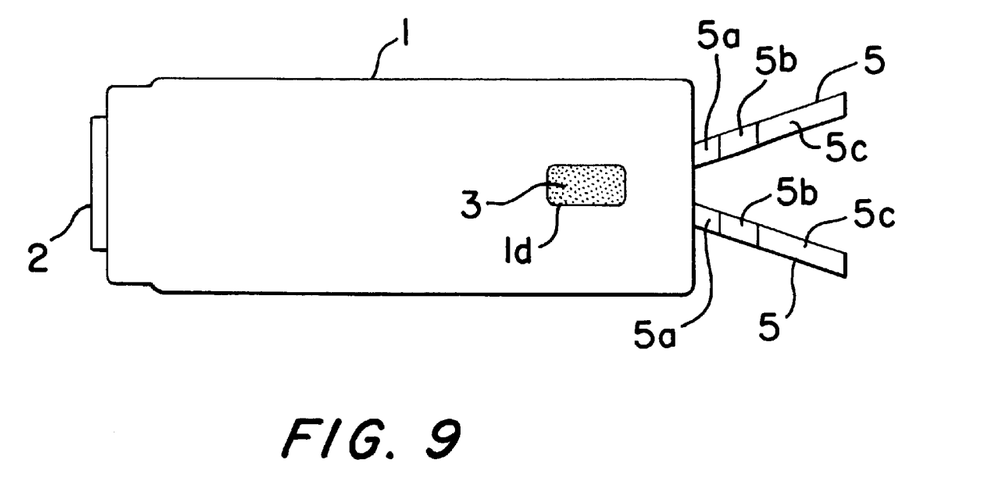
FIG. 9 is a top view of the quartz oscillator of the present invention.

FIG. 8 is a front sectional view of another embodiment of a surface mounting quartz oscillator 4 of the present invention, and shows an outer case 1 having a hole 1d at a portion corresponding to a plug 6, an insertion portion 4b of a protruded cap 4a, an organic resin adhesive 3 for bonding of the quartz oscillator 4, a plug 6 for sealing of the cap 4a, lead terminals 5 coming out from the plug 6, and a reinforcing plate 2. FIG. 9 is a top view of the surface mounting quartz oscillator, and shows the outer case 1 having the hole 1d, the outer lead terminals 5 coming out from the quartz oscillator piece, and the reinforcing plate 2. According to such embodiment 2, it is possible to realize an inexpensive surface mounting quartz oscillator which can be made thinner.

Embodiment 3

Figure 10:
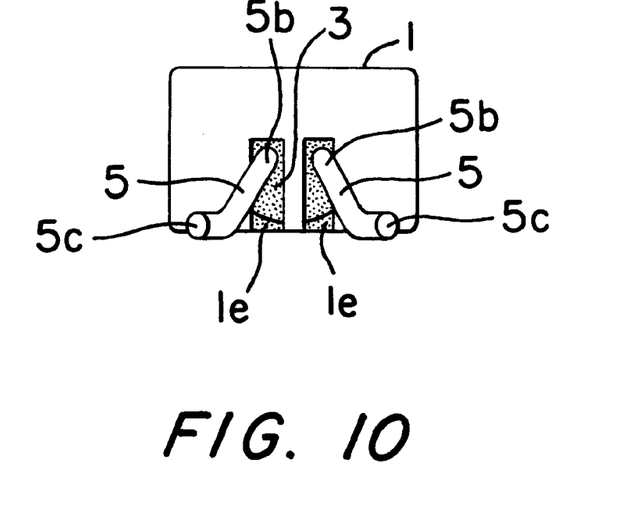
FIG. 10 is a side view of a quartz oscillator of the present invention.

FIG. 10 is a right side view of another embodiment of a surface mounting quartz oscillator of the present invention, in which an outer case 1 has slits 1e for guiding lead terminals 5. According to such embodiment 3, it is possible to realize a surface mounting quartz oscillator in which an organic resin adhesive 3 does not leak out by means of surface tension.

Embodiment 4

Figure 11:
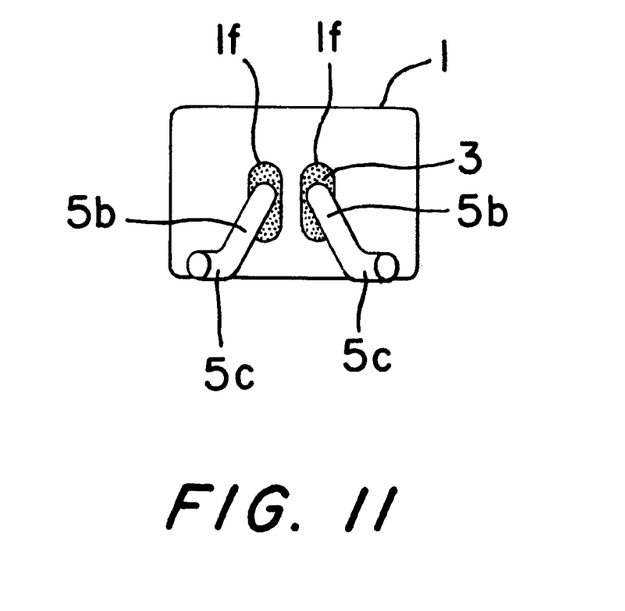
FIG. 11 is a side view of a quartz oscillator of the present invention.

FIG. 11 is a right side view of another embodiment of a surface mounting quartz oscillator of the present invention, in which a case 1 has long and narrow holes 1f for guiding lead terminals 5. According to such embodiment 4, a surface mounting quartz oscillator in which an organic resin adhesive 3 does not leak out by means of surface tension can be realized. According to the above described embodiments, it is possible to realize a surface mounting quartz oscillator which can be easily assembled by a few parts, is inexpensive, and has high accuracy. According to this structure, it is possible to obtain a surface mounting quartz oscillator in which an upper thickness of a case for storing a quartz oscillator inside the bottom surface of the case is at most 0.2 mm, and the total thickness including a diameter of a quartz oscillator is not larger than 1.8 mm.

As described above, according to the present invention, it is possible to realize a small, inexpensive, and high accuracy surface mounting quartz oscillator.

What is claimed is:

1. A surface mountable quartz oscillating device comprising: a quartz oscillator having lead terminals for connection to a circuit board; a generally rectangular outer case having a cavity for storing the quartz oscillator, a first opening portion in a first surface of the outer case extending generally parallel to a longitudinal axis of the outer case for insertion therethrough of the quartz oscillator into the cavity, a second opening portion in a first end surface of the outer case which extends generally transverse to the longitudinal axis and through which the lead terminals of the quartz oscillator extend outside of the outer case when the quartz oscillator is stored in the cavity, and a groove in a second end surface of the outer case which is opposite the first end surface and which extends generally perpendicular to the longitudinal axis; an adhesive disposed in the cavity of the outer case for bonding the quartz oscillator to the outer case; and a reinforcing plate disposed in the groove for securing the outer case to the circuit board.

2. A surface mountable quartz oscillating device as claimed in claim 1; wherein the quartz oscillator has a body and a protrusion extending from the body; and wherein the outer case has a hole in a second surface of the outer case opposite and generally parallel to the first surface for receiving the protrusion.

3. A surface mountable quartz oscillating device as claimed in claim 2; wherein the hole is disposed in a second surface of the outer case opposite to and generally parallel to the first surface thereof.

4. A surface mountable quartz oscillating device as claimed in claim 1; wherein the second opening portion comprises two slits or two holes dimensioned so that the adhesive is prevented from leaking out of the cavity of the outer case.

5. A surface mountable quartz oscillating device as claimed in claim 1; wherein each of the lead terminals of the quartz oscillator has a connection portion for electrical connection by soldering to the circuit board, each of the connection portions having a length 4 to 5 times greater than a diameter of each of the lead terminals.

6. A surface mountable quartz oscillating device as claimed in claim 1; wherein the reinforcing plate is integrally insert molded with the outer case.

7. A surface mountable quartz oscillating device as claimed in claim 1; wherein a thickness of an upper portion of the outer case is at most 0.2 mm, and a total thickness of the outer case including a diameter of the quartz oscillator is not larger than 1.8 mm.

8. A surface mountable quartz oscillating device as claimed in claim 1; wherein each of the lead terminals of the quartz oscillator has a connection portion for electrical connection to the circuit board without contacting the outer case.

9. A surface mountable quartz oscillating device as claimed in claim 8; wherein each of the lead terminals has a first portion and a second portion connecting the connection portion to the first portion, the connection portion extending at an obtuse angle from the second portion.

10. A surface mountable quartz oscillating device as claimed in claim 1; wherein each of the lead terminals has a first portion, a second portion extending from the first portion, and a third portion extending at an obtuse angle from the second portion for electrical connection to the circuit board.

11. A surface mountable quartz oscillating device as claimed in claim 1; wherein the reinforcing plate is comprised of a metal for securely fixing the outer case to the circuit board by reflow soldering.

12. A surface mountable quartz oscillating device as claimed in claim 1; wherein the quartz oscillator comprises a cylindrical housing and a quartz oscillating element disposed in the cylindrical housing and connected to the lead terminals.

13. A crystal oscillating device comprising: an outer case having a longitudinal axis, a cavity, a pair of first surfaces extending along the longitudinal axis, a pair of second surfaces extending in a direction generally transverse to the longitudinal axis, a first opening portion in one of the first surfaces for providing access into the cavity, a second opening portion in one of the second surfaces, and a groove in the other of the second surfaces; a crystal oscillator disposed in the cavity of the outer case and having lead terminals extending through the second opening portion of the outer case for electrically connecting the crystal oscillator to a circuit board; a bonding material disposed in the cavity of the outer case for bonding the crystal oscillator to the outer case; and a connecting member disposed in the groove of the outer case for connecting the outer case to the circuit board.

14. A crystal oscillating device as claimed in claim 13; wherein each of the lead terminals of the crystal oscillator has a connection portion for electrical connection to the circuit board without contacting the outer case.

15. A crystal oscillating device as claimed in claim 14; wherein each of the lead terminals has a first portion and a second portion connecting the connection portion to the first portion, the connection portion extending at an obtuse angle from the second portion.

16. A crystal oscillating device as claimed in claim 13; wherein each of the lead terminals has a first portion, a second portion extending from the first portion, and a third portion extending at an obtuse angle from the second portion for electrical connection to the circuit board.

17. A crystal oscillating device as claimed in claim 13; wherein the reinforcing plate is comprised of a metal for securely fixing the outer case to the circuit board by reflow soldering.

18. A crystal oscillating device as claimed in claim 13; wherein the crystal oscillator comprises a cylindrical housing and a quartz oscillating element disposed in the cylindrical housing and connected to the lead terminals.

19. A crystal oscillating device as claimed in claim 13; wherein the outer case has a hole in the first surface thereof which does not have the first opening portion; and wherein the crystal oscillator has a body and a protrusion extending from the body and disposed in the hole of the outer case.

20. A crystal oscillating device as claimed in claim 13; wherein the outer case is generally rectangular parallelepiped-shaped.

21. A crystal oscillating device as claimed in claim 13; wherein each of the lead terminals has a first portion extending through the second opening portion of the outer case in a direction generally parallel to the longitudinal axis of the outer case, a second portion extending from the first portion at an obtuse angle thereof, and a third portion extending from the second portion at an obtuse angle thereof for electrical connection to the circuit board.

22. A crystal oscillating device as claimed in claim 13; wherein the connecting member comprises a plate member fixed to the groove of the outer case by a press-fit.

23. A crystal oscillating device as claimed in claim 13; wherein the connecting member comprises a plate member fixed to the groove of the outer case by insert molding.

24. A crystal oscillating device as claimed in claim 13; wherein the connecting member comprises a plate member having a plate portion disposed substantially flush with the first surface of the outer case having the first opening portion.

25. A crystal oscillating device comprising: an outer case having a cavity; a crystal oscillator disposed in the cavity of the outer case, the crystal oscillator having an airtight sealed housing, an oscillating element disposed in the housing, and lead terminals each having a first end connected to the oscillating element and a second end extending from the outer case for electrical connection to a circuit board without contacting the outer case; a bonding material disposed in the cavity of the outer case for bonding the crystal oscillator to the outer case; and a connecting member for connecting the outer case to the circuit board; wherein the outer case has a longitudinal axis, a surface extending along the longitudinal axis, and an opening portion in the surface for providing access into the cavity to allow insertion of the crystal oscillator into the cavity.

26. A crystal oscillating device as claimed in claim 25; wherein the connecting member comprises a plate member having a plate portion disposed substantially flush with the surface of the outer case.

27. A crystal oscillating device as claimed in claim 25; wherein the oscillating element of the crystal oscillator is comprised of quartz.

28. A crystal oscillating device comprising: an outer case having a cavity, a longitudinal axis, a surface extending along the longitudinal axis, and an opening portion in the surface for providing access into the cavity; a crystal oscillator disposed in the cavity of and integrally connected to the outer case, the crystal oscillator having an airtight sealed housing and an oscillating element disposed in the housing; and connecting means for integrally connecting the outer case to a circuit board.

29. A crystal oscillating device as claimed in claim 28; wherein the connecting means comprises lead terminals each having a first end connected to the oscillating element of the crystal oscillator and a second end for electrical connection to the circuit board, and a connecting plate integrally connected to the outer case for connection to the circuit board.

30. A crystal oscillating device as claimed in claim 29; wherein each of the lead terminals has a first portion having the first end and extending from the outer case in a direction generally parallel to the longitudinal axis, a second portion extending from the first portion at an obtuse angle thereof, and a third portion having the second end and extending from the second portion at an obtuse angle thereof for electrical connection to the circuit board.

31. A crystal oscillating device as claimed in claim 28; wherein the connecting means comprises lead terminals each having a first end connected to the oscillating element of the crystal oscillator and a second end for electrical connection to the circuit board without contacting the outer case, and a connecting plate integrally connected to the outer case for connection to the circuit board.

32. A crystal oscillating device as claimed in claim 28; further comprising a bonding material disposed in the cavity of the outer case for bonding the crystal oscillator to the outer case.

33. A crystal oscillating device as claimed in claim 28; wherein the oscillating element of the crystal oscillator is comprised of quartz.

* * * * *